(12) United States Patent
Kondrus et al.

(10) Patent No.: US 12,029,001 B2
(45) Date of Patent: Jul. 2, 2024

(54) EXPLOSION-PROOF APPARATUS WITH A FLAMEPROOF GAS FLOW PATH AND HEAT SINK

(71) Applicant: R. Stahl Schaltgeräte GmbH, Waldenburg (DE)

(72) Inventors: Elena Kondrus, Künzelsau (DE); Jürgen Schmitt, Öhringen (DE); Bernd Limbacher, Schwäbisch Hall (DE)

(73) Assignee: R. Stahl Schaltgeräte GmbH, Waldenburg (DE)

( * ) Notice: Subject to any disclaimer, the term of this patent is extended or adjusted under 35 U.S.C. 154(b) by 355 days.

(21) Appl. No.: 17/427,008

(22) PCT Filed: Jan. 20, 2020

(86) PCT No.: PCT/EP2020/051231
§ 371 (c)(1),
(2) Date: Jul. 29, 2021

(87) PCT Pub. No.: WO2020/156848
PCT Pub. Date: Aug. 6, 2020

(65) Prior Publication Data
US 2022/0132692 A1   Apr. 28, 2022

(30) Foreign Application Priority Data

Jan. 31, 2019 (DE) .................. 10 2019 102 505.2

(51) Int. Cl.
*H05K 5/06* (2006.01)
*H02B 1/28* (2006.01)
(Continued)

(52) U.S. Cl.
CPC .......... *H05K 5/068* (2013.01); *H05K 7/2039* (2013.01)

(58) Field of Classification Search
CPC .... H05K 5/068; H05K 5/0214; H05K 5/0215; H05K 5/0216; H05K 5/136; H05K 7/2039; H05K 7/206; H02B 1/56; H02B 1/128
See application file for complete search history.

(56) References Cited

U.S. PATENT DOCUMENTS

| | | |
|---|---|---|
| 4,180,177 A | 12/1979 | Gunderman et al. |
| 4,484,690 A | 11/1984 | Nash |
| (Continued) | | |

FOREIGN PATENT DOCUMENTS

| | | |
|---|---|---|
| CN | 104421469 A | 3/2015 |
| CN | 206479918 U | 9/2017 |
| (Continued) | | |

OTHER PUBLICATIONS

Indian Examination Report for IN 202137033461, dated Dec. 27, 2022, 5 pgs.

*Primary Examiner* — Timothy J Thompson
*Assistant Examiner* — Amol H Patel
(74) *Attorney, Agent, or Firm* — Blank Rome LLP

(57) ABSTRACT

An explosion-proof apparatus with an explosion-proof housing and a cooling device. The explosion-proof housing has a plurality of outer walls enclosing a housing interior. A pressure-relief arrangement of the cooling device has at least one pressure relief opening with at least one gas-permeable, flameproof pressure-relief body. The pressure-relief opening passes through at least one of the outer walls. The cooling device also has at least one heat sink which forms at least one heat sink wall part of one the outer walls and which, as a heat sink wall part of this outer wall, directly borders, on its outer face, the surrounding area and directly borders, on its inner face, the housing interior.

14 Claims, 7 Drawing Sheets

(51) Int. Cl.
*H02B 1/56* (2006.01)
*H02K 5/136* (2006.01)
*H05K 7/20* (2006.01)

(56) References Cited

U.S. PATENT DOCUMENTS

| | | | |
|---|---|---|---|
| 8,512,430 B2 | 8/2013 | Manahan et al. | |
| 2010/0064949 A1 | 3/2010 | Lüling et al. | |
| 2013/0201627 A1 | 8/2013 | Limbacher et al. | |
| 2013/0206759 A1 | 8/2013 | Wurz et al. | |
| 2015/0060445 A1* | 3/2015 | Mann | A62C 3/16 29/451 |
| 2015/0060465 A1* | 3/2015 | Limbacher | H05K 5/0213 220/560.01 |
| 2015/0082811 A1 | 3/2015 | Rangarajan et al. | |
| 2017/0319881 A1 | 11/2017 | Barz | |
| 2019/0311970 A1* | 10/2019 | Minami | H01L 23/36 |
| 2020/0149852 A1 | 5/2020 | Arnhold | |

FOREIGN PATENT DOCUMENTS

| | | | |
|---|---|---|---|
| CN | 207801186 U | 8/2018 | |
| CN | 208174105 U | 11/2018 | |
| CN | 208272453 U | 12/2018 | |
| DE | 10 2010 016 782 A1 | 11/2011 | |
| DE | 10 2012 110 001 A1 | 4/2014 | |
| DE | 10 2013 109 260 A1 | 3/2015 | |
| DE | 10 2017 112 159 A1 | 12/2018 | |
| DE | 102017112149 A1 | 12/2018 | |
| EP | 2 842 609 A2 | 3/2015 | |
| EP | 2909901 A1 | 8/2015 | |
| FR | 3019944 A1 | 10/2015 | |
| RU | 2 448 228 C2 | 4/2012 | |
| RU | 2 563 886 C2 | 9/2015 | |
| WO | WO-2011/138325 A1 | 11/2011 | |
| WO | 2014060528 A1 | 4/2014 | |
| WO | WO-2014060528 A1 * | 4/2014 | H01H 9/042 |
| WO | WO 2016/070874 A1 | 5/2016 | |

* cited by examiner

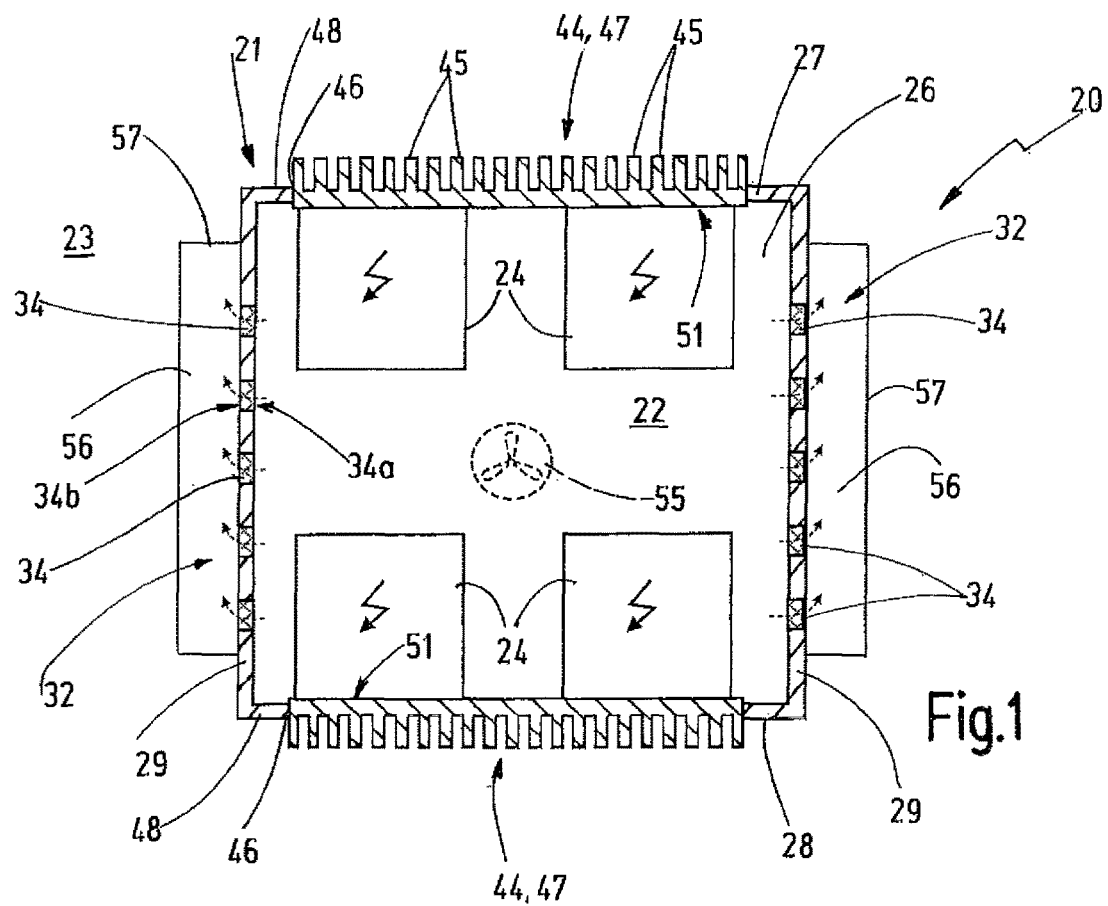
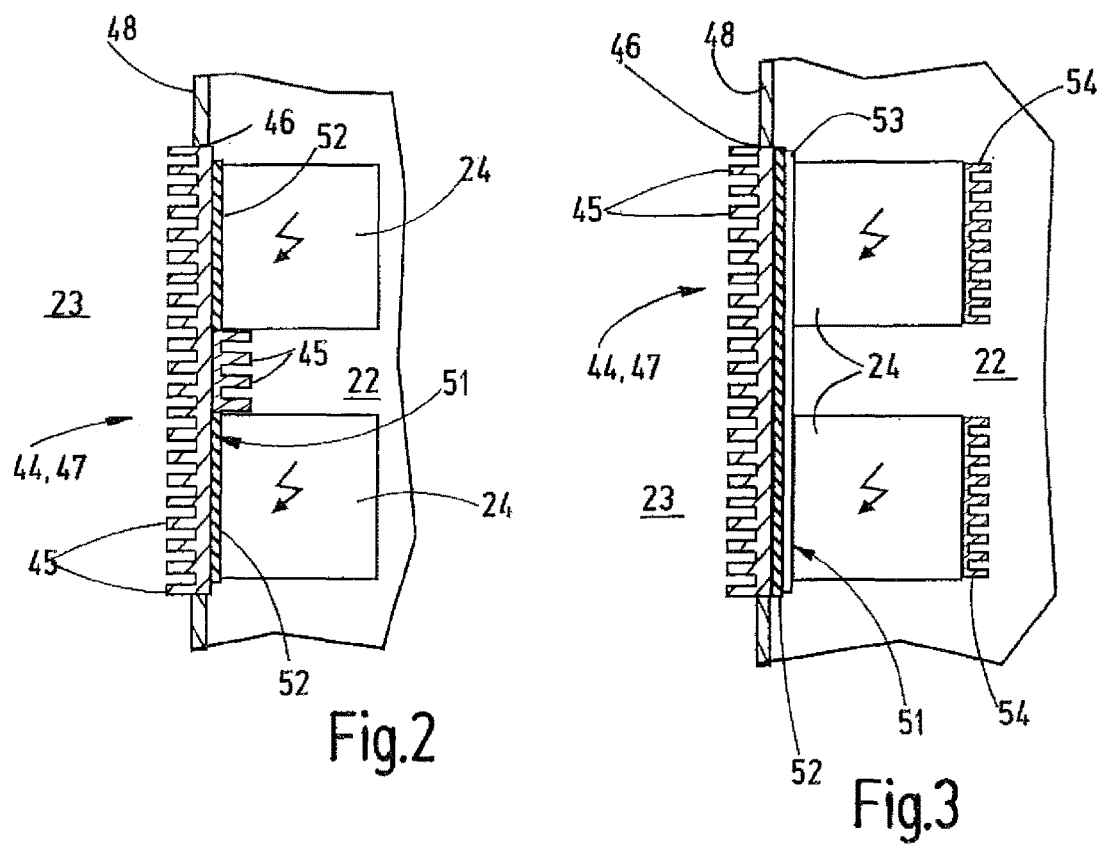
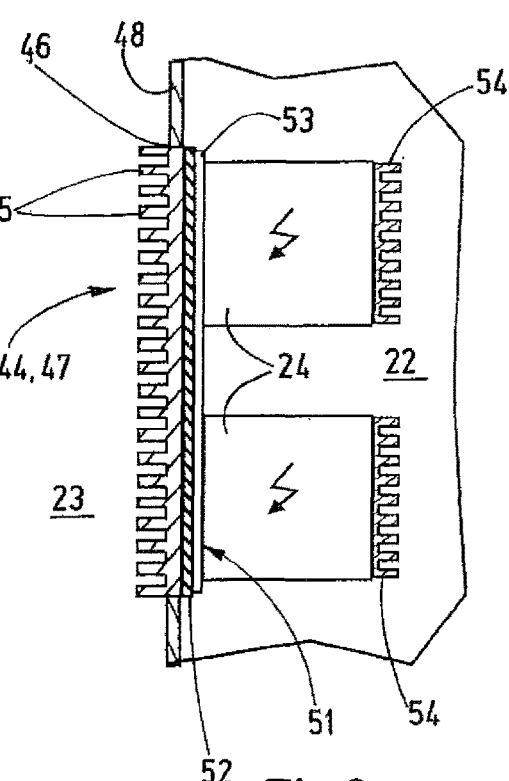
Fig.1
Fig.2
Fig.3

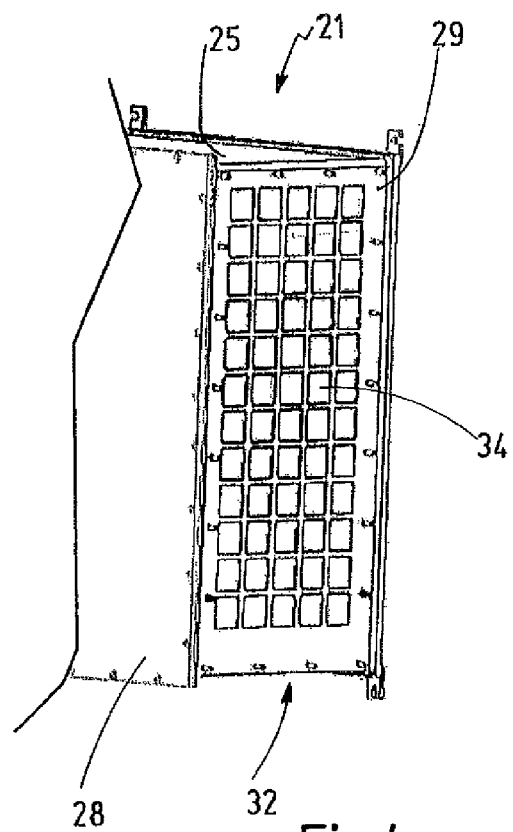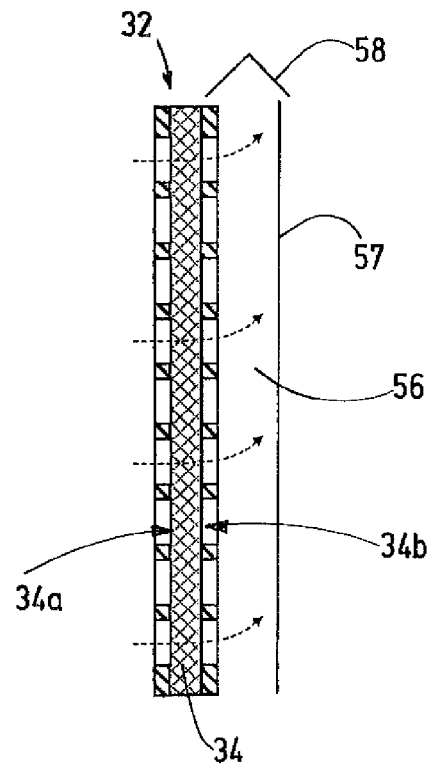
Fig.4    Fig.5
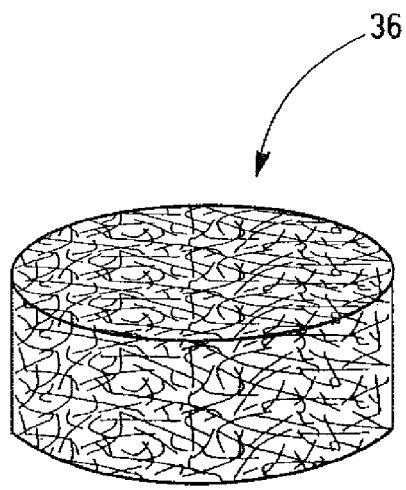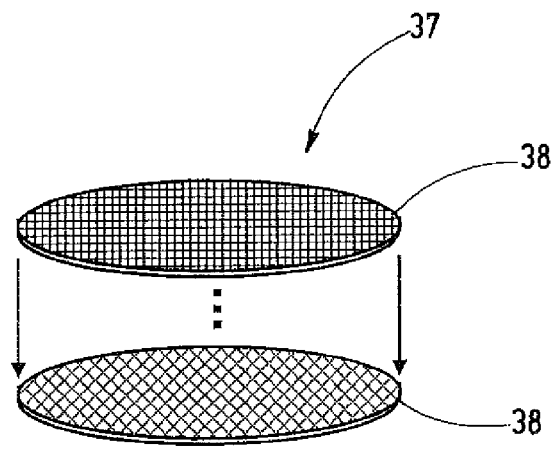
Fig.6    Fig.7

EXPLOSION-PROOF APPARATUS WITH A FLAMEPROOF GAS FLOW PATH AND HEAT SINK

CROSS REFERENCE TO RELATED APPLICATIONS

This application is a national phase of PCT/EP2020/051231, filed Jan. 20, 2020, which claims priority to German Application No. 10 2019 102 505.2, filed Jan. 31, 2019, the subject matter of each of which are incorporated by reference herein in their entirety.

BACKGROUND

The invention refers to an explosion-proof device having an explosion-proof enclosure. The enclosure has multiple outer walls that surround an enclosure interior and that separate it from an explosive atmosphere in an environment.

Such a device is, for example, known from DE 10 2012 110 001 A1. There an explosion-proof enclosure is proposed that creates a gas flow only inside of the enclosure. The heat that is created in the enclosure interior due to the operation of electrical or electronic devices is dissipated to the outside due to heat conduction via the housing walls. For this heat sinks can be present inside or outside on an enclosure wall.

The heat dissipation from an interior of an explosion-proof enclosure to the environment is a particularly critical issue in explosion-proof devices. On one hand, the electrical and/or electronic devices to be cooled arranged in the enclosure interior have to be sufficiently cooled in order to maintain their functionality. On the other hand, an ignition of the explosive atmosphere has to be reliably precluded. Also the temperature of the outer wall of the explosion-proof enclosure must not reach critical temperature values, because otherwise the outer walls of the enclosure could serve as ignition source for the surrounding explosive atmosphere.

BRIEF SUMMARY

Thus, it can be considered as object of the present invention to improve an explosion-proof device in a way such that it offers an improved explosion protection.

This object is solved by the explosion-proof device having the features of claim 1.

The explosion-proof device has an explosion-proof enclosure with multiple outer walls. The outer walls surround an enclosure interior and separate it from an explosive atmosphere in the environment of the explosion-proof enclosure. The explosion-proof device comprises a pressure relief arrangement with at least one gas permeable flameproof pressure relief body. In addition, at least one pressure relief opening is part of the pressure relief arrangement that at least passes completely through one of the outer walls of the explosion-proof enclosure. At least one of the pressure relief bodies is arranged in each pressure relief opening, wherein the at least one pressure relief body covers the pressure relief opening in a manner such that a flameproof gas flow path is formed through the respective pressure relief opening and the pressure relief body. The pressure relief body can be at least partly arranged inside the assigned pressure relief opening and/or at least partly outside the assigned pressure relief opening. For example, the pressure relief body can be completely accommodated in the pressure relief opening. As an alternative it is also possible to attach a pressure relief body adjoining the pressure relief opening on an outer wall section surrounding the respective pressure relief opening, e.g. in the enclosure interior or outside adjoining the environment.

In addition, the explosion-proof device has a cooling device having at least one heat sink. The cooling device is configured to dissipate heat out of the enclosure interior to the outside in the environment. For example, one or more electrical and/or electronic devices can create heat in the enclosure interior that is then dissipated by means of the cooling device to the outside in the environment.

The at least one heat sink forms at least a part of at least one outer wall of the enclosure. The at least one heat sink can thus either form at least one outer wall completely or only a part of at least one outer wall and each part of the at least one outer wall formed by a heat sink is denoted as heat sink wall part for improved distinctness. In contrast the section(s) of one or more outer walls that are not formed by a heat sink are denoted as enclosure wall part(s). The at least one heat sink wall part and the at least one enclosure wall part form together the outer walls of the enclosure.

The at least one heat sink wall part directly adjoins the environment at the outside as well as the enclosure interior at the inside. In doing so, the heat sink can directly transfer heat from its side facing the enclosure interior to the side facing the environment by means of heat conduction.

The at least one heat sink consists of a heat conductive material, e.g. from metal or a metal alloy and can for example contain aluminum or copper. The at least one heat sink can consist of ceramic or another material as well. Its thermal conductivity is preferably larger than the thermal conductivity of the at least one enclosure wall part of the outer walls.

The at least one heat sink can be varnished or anodized.

Through the at least one flameproof gas flow path a pressure relief possibility is established in case of an explosion inside of the enclosure interior. The gas or explosion pressure that the enclosure including the outer walls as well as the at least one heat sink has to withstand, is remarkably reduced by the pressure relief arrangement. In doing so, it is possible to configure the at least one wall part by a standard heat sink that can be, for example, realized as extrusion profile part. Such heat sinks are cheap and available on the market. An adaption of the at least one heat sink for increasing the stability in order to be able to form part of an explosion-proof enclosure is not necessary according to the invention. The flow cross-section of the one or more gas flow paths of the pressure relief arrangement is selected in a manner such that the explosion pressure in the enclosure interior is limited to a predefined maximum pressure value.

A part of the cooling effect can also be established by convection, in that air flows along the at least one gas flow path of the pressure relief arrangement from the enclosure interior to the outside. Preferably the portion of heat that is dissipated by means of a gas or air flow through the pressure relief arrangement to the outside is remarkably smaller than the heat that is dissipated to the outside via the at least one heat sink by convection. For example, the portion of heat dissipated via the at least one heat sink to the outside can be at least 80% to 90% of the heat created in the enclosure interior.

By means of the cooling device and the heat dissipation from the enclosure interior to the environment it is also avoided that on the outer walls of the enclosure high wall temperatures are locally reached that could serve as ignition source for the explosive atmosphere in the environment of the enclosure.

In a preferred embodiment the at least one heat sink or at least one heat sink of one or more provided heat sinks is inserted in an assigned wall recess in one of the outer walls. The wall recess passes completely through the outer wall. The remaining wall section can form a frame or edge of the wall recess and can surround it completely. For example, the heat sink can be connected with a surrounding or adjoining enclosure wall part of one or more outer walls by means of an adhesive bond inside the wall recess.

The heat sink wall part can be connected with the enclosure wall part by means of an adhesive bond. Because no heat conductive connection is required between the at least one heat sink and the at least one enclosure wall part, a simple adhesive bond, particularly a gluing connection, can be established. The thermal barrier created thereby is uncritical. Measures for establishment of heat conductivity between the at least one heat sink or the at least one heat sink wall part and the at least one enclosure wall part are not required.

The at least one heat sink can be arranged on the respective enclosure wall part in a force-fit and/or form-fit and/or substance bond manner and/or by means of adhesive bond, e.g. by means of screwing and/or clamping and/or gluing and/or clipping and/or welding and/or the like.

The at least one heat sink can be configured integrally or can be formed of multiple parts. For example, the at least one heat sink can be configured as extruded profile.

The at least one heat sink can comprise cooling fins arranged in the enclosure interior and/or in the environment. In doing so, the heat absorption in the enclosure interior or the heat transfer in the environment can be improved.

The cooling fins are preferably orientated in a vertical plane, particularly in a manner such that a gap limited between two adjacent cooling fins extends substantially vertically. In doing so, heated, vertically upward rising gas can flow better between the cooling fins.

The at least one heat sink can be configured such that its cooling surface adjoining the environment or the enclosure interior is at least about the factor 2 or 3 or 4 larger than the cross-sectional area of the heat sink wall part formed by the at least one heat sink.

One of the outer walls of the enclosure can be at least partly configured as door, flap or cover in order to allow access to the enclosure interior. The at least one heat sink can be arranged at or in any of the outer walls, e.g. also in or on the door, flap or cover. It is advantageous, if a heat sink wall part formed by a heat sink forms, for example, the door, flap or cover of the enclosure.

The cooling surface of the at least one heat sink can be anodized or varnished. In doing so, the emissivity can be increased.

The at least one gas permeable flameproof pressure relief body has in an embodiment an inner side directly adjoining the enclosure interior and an outer side directly adjoining the environment. The at least one pressure relief body can have a surface on the inner and/or outer side that is larger than the remaining surface of the respective outer wall or the respective enclosure wall part. The pressure relief body can also form the whole outer wall.

In an embodiment at least one pressure relief opening having a pressure relief body is provided in a top outer wall of the enclosure. In addition or as an alternative, at least one pressure relief opening having a pressure relief body can be provided in at least one lateral outer wall. In addition or as an alternative, at least one pressure relief opening having a pressure relief body can be provided in a bottom outer wall. It is particularly advantageous, if in two respective opposite outer walls at least one pressure relief opening having a pressure relief body is provided respectively.

Preferably either a heat sink or a pressure relief body is provided in an outer wall. In this embodiment the respective outer wall serves either to comprise at least a portion of the gas flow path or to provide the heat conduction by means of at least one heat sink.

In a preferred embodiment a mounting surface for an electrical and/or electronic device to be cooled is provided in the enclosure interior. In an embodiment the mounting surface—or at least one of the mounting surfaces in case of multiple mounting surfaces—is formed on the side of the at least one heat sink facing the enclosure interior. Thus, the electrical and/or electronic device can be directly arranged on the mounting surface of the at least one heat sink such that a particularly well heat transfer from the electrical and/or electronic device to the heat sink can be achieved.

As an alternative or in addition, at least one mounting wall can be provided in the enclosure interior on which one or more mounting surfaces are formed. In this embodiment the at least one heat sink can be thermally conductively connected with the mounting wall, particularly directly or via a thermally conductive intermediate layer. Such an intermediate layer can be, for example, a thermally conductive adhesive, a thermally conductive pad or a thermally conductive paste. A thermally conductive pad can consist, for example, of mica and/or silicone rubber and/or polyimide. Particularly the direct or indirect connection between the at least one mounting wall and the at least one heat sink is configured such that no gas or air gap exists between the at least one heat sink and the at least one mounting wall. As explained, thermally conductive intermediate layers can be provided as an option for improving the heat conduction contact.

In an embodiment the cooling device comprises at least one fan. The fan is particularly arranged in the enclosure interior. In doing so, the cooling by convection can be further improved.

In a preferred embodiment the enclosure is configured in the explosion protection category "flameproof enclosure (Ex-d)" according to DIN EN 60079-1.

BRIEF DESCRIPTION OF THE DRAWINGS

Advantageous embodiments of the explosion-proof device can be derived from the dependent claims, the description and the drawings. In the following, preferred embodiments are explained in detail based on the attached drawings. The drawings show:

FIG. 1 a schematic block diagram-like illustration of an embodiment of an explosion-proof device, FIGS. 2 and 3 a block diagram-like schematic illustration respectively for arranging at least one heat sink in an outer wall of an explosion-proof enclosure, FIG. 4 a view of an outer wall of an explosion-proof enclosure having at least a part of a pressure relief arrangement, FIG. 5 a schematic cross-sectional illustration through the outer wall of FIG. 4, FIGS. 6 and 7 a schematic perspective illustration respectively of a configuration or a structure for forming a gas permeable flameproof pressure relief body, FIGS. 8-12 embodiments of an explosion-proof device respectively having an explosion-proof enclosure in a perspective illustration.

DETAILED DESCRIPTION

Figure 8:
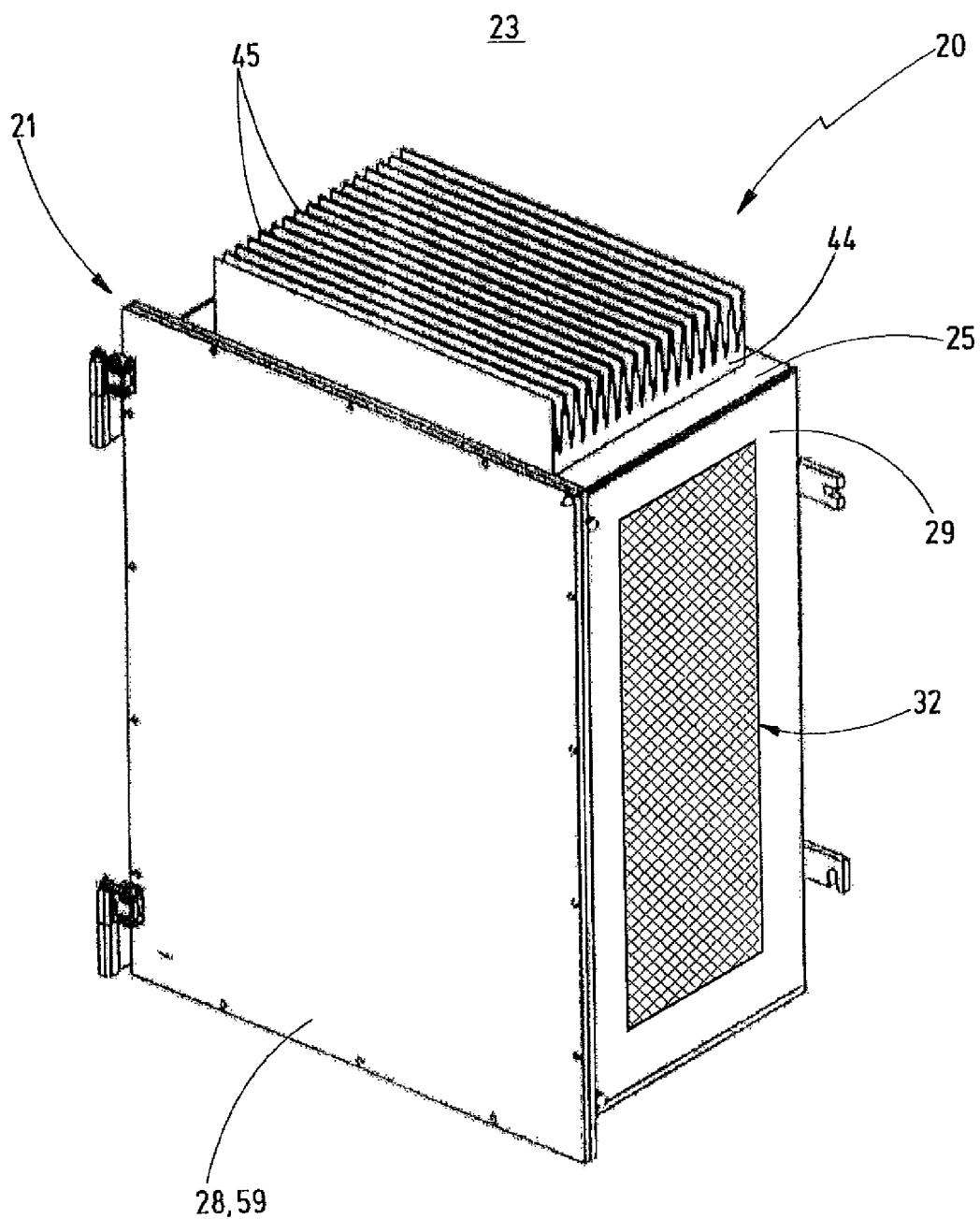

FIG. 1 shows an embodiment of an explosion-proof device 20 comprising an explosion-proof enclosure 21 in a sectional illustration. The explosion-proof enclosure 21 can be configured in the explosion protection category flameproof enclosure (Ex-d) according to DIN EN 60079-1. It encloses an enclosure interior 22 and separates it in an explosion-proof manner from an environment 23 in which an explosive atmosphere is present. One or more electrical and/or electronic devices 24 can be arranged in the enclosure interior 22. Because such devices 24 can serve as potential ignition source for the explosive atmosphere in the environment 23, they are enclosed in an explosion-proof manner in the enclosure interior 22.

The explosion-proof enclosure 21 has multiple outer walls 25-29 that enclose the enclosure interior 22. According to the example, the explosion-proof enclosure 21 is configured in a cuboid-shaped manner. It has a top outer wall 25 (see FIGS. 4 and 8-12), to which a bottom outer wall 26 is opposed. The top outer wall 25 and the bottom outer wall 26 are connected with each other via a rear outer wall 27 and a front outer wall 28. The rear outer wall 27 and the front outer wall 28 are opposed to one another. The two lateral outer walls 29 are also opposed to one another and connect the rear outer wall 27 with the front outer wall 28. The top outer wall 25 is not apparent from FIG. 1 due to the horizontal sectional illustration.

The outer walls 25-29 can be connected with each other, e.g. by means of welding, gluing or another suitable connection method. At least some of the outer walls 25-29 can also be integrally configured, e.g. in that they are manufactured integrally, e.g. by molding of at least some or all of the outer walls 25-29.

Obviously the explosion-proof enclosure 21 can also have other shapes different from the cuboid form, e.g. a cylindrical form.

In addition, a cooling device 43 is part of the explosion-proof device 20. The cooling device 43 is configured to dissipate heat from the enclosure interior 22 into the environment 23 in order to keep the temperature inside the enclosure interior 22 sufficiently low, such that the functionality of the at least one electrical and/or electronic device 24 is ensured. In addition, the cooling device 43 is configured to keep the temperature of the outer walls 25-29 below a threshold, such that the outer walls 25-29 do not form an ignition source for the explosive atmosphere in the environment 23.

The cooling device 43 comprises at least one heat sink 44. Preferably the heat sink 44 has one or more cooling ribs 45 and/or cooling tabs and/or cooling fins at least on its outer side facing the environment 23 in order to increase its cooling surface. The heat sink 44 forms at least a part of an assigned outer wall 25-29 that is denoted as heat sink wall part 47. The heat sink 44 can either form the whole respective outer wall 25-29 or can be arranged in a wall recess 46 of an assigned outer wall 25-29. The at least one heat sink 44 thus forms at least one heat sink wall part 47 that is connected with a remaining enclosure wall part 48 surrounding the respective wall recess 46. Between the at least one heat sink 44 and the surrounding enclosure wall part 48 an adhesive bond connection can exist, e.g. a gluing connection.

The at least one heat sink 44 consists preferably of a material having a thermal conductivity that is larger than the remaining enclosure wall part 48. In the preferred embodiment the at least one heat sink 44 is made of a metallic material and/or a metallic alloy and preferably configured as extrusion profile part. The at least one heat sink 44 can consist of or at least comprise aluminum or copper, for example. In another embodiment the at least one heat sink 44 can consist of ceramic. The at least one heat sink 44 can be varnished or anodized.

Such heat sinks are commercially available as standard heat sinks and can be used according to the invention in a simple and cheap manner for the explosion-proof device 20. Measures to increase the mechanical strength or stability of the at least one heat sink 44 are not necessary.

In an embodiment the cooling ribs 45 are substantially orientated vertically, such that the interstice between two directly adjacent cooling ribs 45 form a channel that is open vertically to the top and to the bottom. In doing so, the natural convection in case of rising warm gas or warm air can be used for a good flow passing through the interstice between the cooling ribs 45. In embodiments in which at least one heat sink 44 is attached to the top outer wall 25 or the bottom outer wall 26, for example, the cooling ribs 45 can also have another orientation (compare for example FIG. 8).

In addition to the basic illustration in FIG. 1, the at least one heat sink 44 can also have one or more cooling ribs 45 that face the enclosure interior 22 (compare for example FIGS. 2, 9, 11 and 12).

In modification to the illustrated embodiments, the cooling ribs 45 do not need to extend substantially linearly and parallel to one another, but can also be angled and/or bent. In addition or as an alternative, it is also possible that one or more cooling ribs 45 have a T-shaped or Y-shaped cross-section.

Inside the enclosure interior 22 at least one mounting surface 51 for the at least one electrical and/or electronic device 24 is provided. As exemplarily illustrated in FIGS. 1-3, the at least one heat sink 44 can comprise the at least one mounting surface 51. The electrical and/or electronic device 24 can be arranged directly and particularly without gas or air gap on the mounting surface 51 in order to establish a two-dimensional and good heat conduction contact as far as possible. Thus, the heat created by the respective electrical and/or electronic device 24 can be transferred in the respective heat sink 44 in a conductive manner and can be dissipated therefrom in the environment 23. The direct thermal coupling between the at least one electrical and/or electronic device 24 and the respective mounting surface 51 on the heat sink 44 is exemplarily illustrated in FIG. 1.

Alternative embodiments are schematically illustrated in FIGS. 2 and 3. In the embodiment shown in FIG. 2 an intermediate layer 52 is present between the at least one electrical and/or electronic device 24 and the mounting surface 51. This intermediate layer 52 serves for creation of a good heat conduction connection that can be formed by a thermally conductive paste or a thermally conductive pad.

In the modified embodiment illustrated in FIG. 3 the mounting surface 51 is not directly provided on the at least one heat sink 44, but on a separate mounting wall 53 or mounting plate arranged in the enclosure interior 22. The mounting wall 53 or the mounting plate is thermally conductively connected with the at least one heat sink 44. This heat conduction connection can be established by direct two-dimensional thermally conductive contact and/or by means of an intermediate layer 52, as exemplarily shown in FIG. 3.

In addition, FIG. 3 illustrates another possible configuration with one or more additional heat sinks 54 that can be arranged in the enclosure interior 22 and can be directly connected in a thermally conductive manner with an electrical and/or electronic device 24, for example. Such additional heat sinks 54 can be provided in all of the embodiments.

In all of the embodiments the at least one heat sink 44 extends completely through the assigned enclosure wall 25-29 and is thus accessible from the enclosure interior 22 as well as from the environment 23. In doing so, a very effective heat conduction connection between the enclosure interior 22 and the environment 23 can be established independent from a gas or air flow.

The configuration of one or more outer walls 25-29 with a heat sink wall part 47 that is formed by the respective heat sink 44 influences the structural integrity of the enclosure 21. This is particularly the case, if standard heat sinks without mechanical strengthening are used as heat sink 44 or heat sink wall part 47, e.g. extrusion profile parts. In order to limit the explosion pressure that is present in the enclosure interior 22 in case of a potential explosion, a pressure relief arrangement 32 is present according to the invention that guarantees sufficiently large volume flow of a gas flow from the enclosure interior 22 in the environment 23 in case of an explosion.

As an option the cooling device 43 can comprise a fan 55 that can be arranged in the enclosure interior 22 in order to improve the cooling.

The pressure relief arrangement 32 comprises at least one gas permeable flameproof pressure relief body 34 arranged in at least one pressure relief opening 33 of the enclosure 21. The at least one pressure relief body 34 is arranged in or on the assigned pressure relief opening 33 of an outer wall 25-29, such that the flameproof gas flow path is established through the at least one pressure relief opening 33 and the at least one pressure relief body 34 between the enclosure interior 22 and the environment 23. Each pressure relief opening 33 passes completely through an outer wall 25-29. As illustrated in FIG. 1, multiple pressure relief openings 33 can be arranged in one single outer wall (e.g. lateral outer wall 29) or in multiple outer walls 25-29. In or on each provided pressure relief opening 33 at least one pressure relief body 34 is arranged in order to establish the flameproof condition of the gas flow path. Thereby multiple pressure relief openings 33 can be covered or configured in a flameproof manner by one common pressure relief body 34.

In the example shown in FIG. 1 multiple pressure relief openings 33, having at least one pressure relief body 34 respectively, are arranged in the two lateral outer walls 29. In modification thereto the at least one pressure relief opening 33 having at least one pressure relief body 34 can also be provided in or on any other of the outer walls 25-29. Whether and in which of the outer walls 25-29 one or more pressure relief openings 33 or pressure relief bodies 34 are arranged, can be determined depending on the application in order to optimize the gas flow along the gas flow path for explosion pressure limitation. The gas flow along the gas flow path through the whole pressure relief arrangement 32 is schematically illustrated in FIG. 1 by dashed arrows.

The at least one pressure relief body 34 can be directly or indirectly connected in and/or on the respective pressure relief opening 33 or an area of the respective outer wall 25-29 surrounding the respective pressure relief opening 33 in a force-fit and/or form-fit and/or substance bond manner or by means of an adhesive bond. It can be connected, e.g. by a screw connection and/or by gluing and/or by welding and/or the like with the respective outer wall 25-29.

The at least one pressure relief body 34 is formed by a porous and/or mesh-comprising material structure according to the example that allows a gas exchange through the material structure and on the other hand extinguishes or blocks flames, sparks and hot gases from reaching the environment 23. In doing so, the material structure ensures the flameproof condition of the gas flow path and concurrently allows a gas flow along the gas flow path having a high volume flow rate for convection cooling amongst others. The thickness of the at least one pressure relief body 34 in gas flow direction has an amount of, for example, at least 5 mm or at least 10 mm. In the described embodiment each pressure relief body 34 has an inner side 34a directly adjoining the enclosure interior 22 and an outer side 34b directly adjoining the environment. The thickness of the pressure relief body 34 is thereby measured along the shortest path between the inner side 34a and the outer side 34b.

Preferably each pressure relief body 34 is made from a material having a temperature resistance of at least 400° C. For example, the pressure relief body 34 can be manufactured from chromium alloy steel, e.g. stainless steel. The pressure relief body 34 can comprise an entangled fiber structure and/or a grid structure and/or another porous structure or mesh-comprising structure. In the example, schematically illustrated in FIG. 6, a porous body 36 has, for example, disorderly arranged fibers that are entangled with one another in order to form an entangled fiber structure of the porous body 36. The fibers can have a diameter of 70 μm to 130 μm. In modification thereto the porous body 36 can be formed of porous sinter material and/or porous form material or the like. The pore size of the porous body 36 has an amount of at least 80 μm and at most 250 μm. The porosity of the porous body 36 is in a range of 60% to 80% in the embodiment.

Another possibility of a material structure for use as pressure relief body 34 is schematically illustrated in FIG. 7. There a grid body 37 is illustrated comprising multiple grid layers 38 that are arranged on top of each other or are piled up, so to speak. The individual grid layers 38 can be connected with each other in a force-fit and/or form-fit and/or substance bond manner or by adhesive bond. In doing so, a grid body 37 having an effective mesh size can be achieved, all-in-all being at least 80 μm and at most 250 μm. The grid rods of the individual grid layers can be orientated offset and/or inclined under an angle with regard to one another in order to achieve the effective mesh size of the grid body 37. The number of individual grid layers 38 can vary depending on the configuration of each individual grid layer 38 in order to achieve the desired effective mesh size of the grid body 37 and the thickness indicated above.

For forming a pressure relief body 34, a porous body 36 and/or a grid body 37 can be used. In FIGS. 6 and 7 cylindrical configurations of the bodies 36, 37 are illustrated, which is only exemplarily for explanation of the respective structure. The outer contour depends on the desired outer contour of the pressure relief body 34 to be created. The at least one pressure relief body 34 can be cylindrically, prismatically, cuboid-shaped, plate-shaped or can be configured having another arbitrary contour.

An embodiment of an outer wall having a pressure relief body 31 is illustrated in FIGS. 4 and 5 in which nearly the whole outer wall—and according to the example, the lateral outer wall 29—is formed by the pressure relief body 34. In this embodiment the pressure relief body 34 is arranged between two holding elements 39 comprising throughholes. The two holding elements 39 hold the pressure relief body 34 in between in a sandwich-like manner. The holding elements 39 are configured in a grid-like manner according to the example.

In FIGS. 8-12 different configurations of the device 20 having a respective explosion-proof enclosure 21 are illustrated. The area of an outer wall 25-29 with at least one pressure relief opening 33 and at least one pressure relief body 34 is schematically illustrated in a cross-hatched manner and can be configured in a manner analog to the configuration shown in FIGS. 4 and 5. Alternatively, one single pressure relief body 34 without holding elements 39 can be provided in a pressure relief opening 33 in this area that, for example, is connected in the area of its periphery with a surrounding outer wall 25-29, particularly in a substance bond manner or by adhesive bond.

In the embodiments according to FIGS. 8-12 the front outer wall 28 is configured as pivotable door 59. Alternatively to this in the front outer wall 28 a pivotable door 59 can be arranged. The door 59 is preferably pivotable around a substantially vertical pivot axis between an open position (FIGS. 9-12) and a closed position (FIG. 8).

In the embodiment illustrated in FIG. 8 a portion of the top outer wall 25 is configured as heat sink wall part 47 by means of a heat sink 44. In the two lateral outer walls 29 at least one pressure relief opening 33 with at least one pressure relief body 34 is provided respectively.

In all of the embodiments according to FIGS. 8-12 either at least one pressure relief opening 33 with at least one pressure relief body 34 or else a heat sink 44 is provided respectively on or in one of the outer walls 25-29. A combination of at least one pressure relief opening 33 with at least one pressure relief body 34 as well as a heat sink 44 on a common outer wall 25-29 is not provided according to the example, could however also be realized in not illustrated embodiments.

Figure 9:
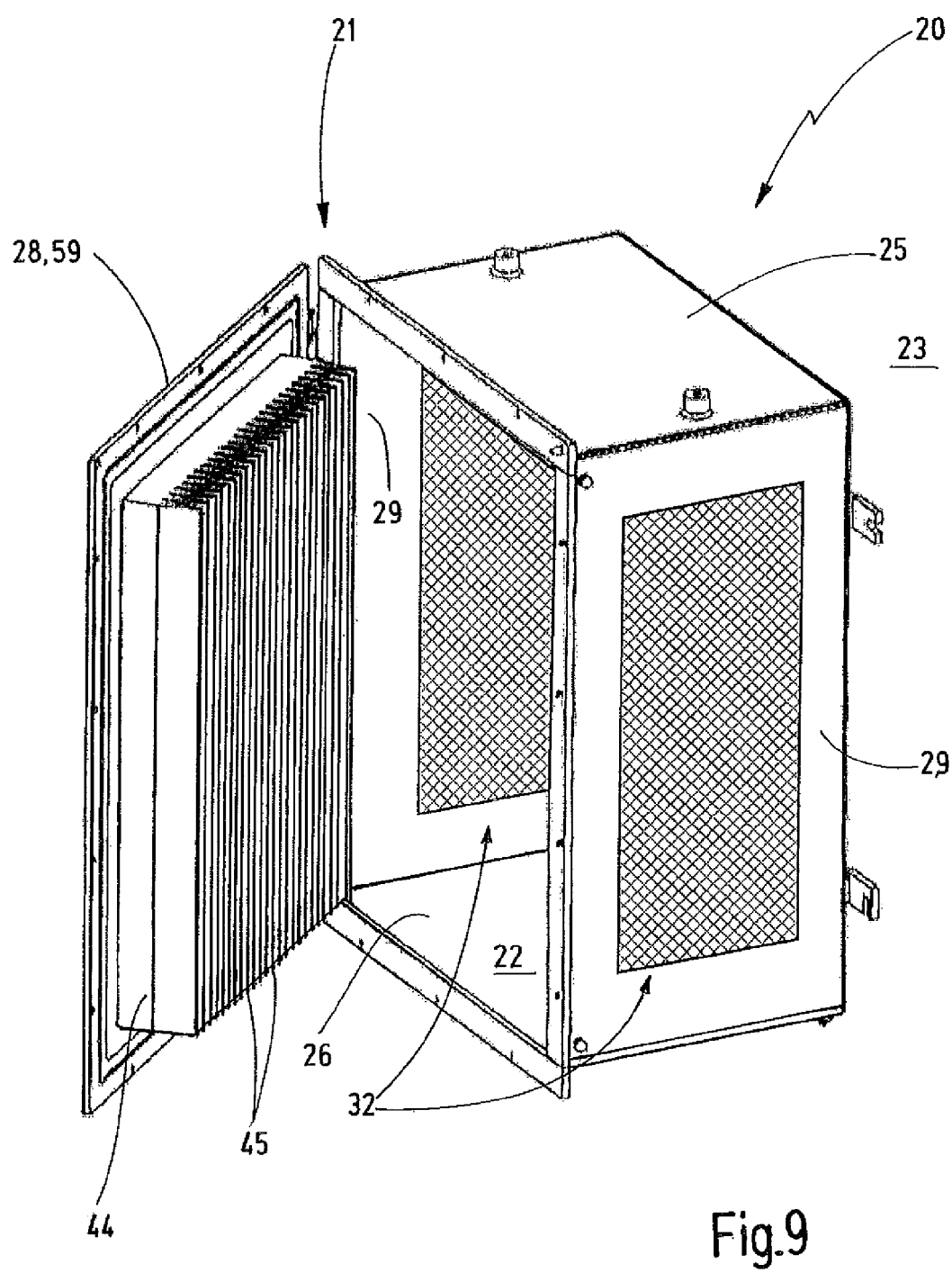
Figure 10:
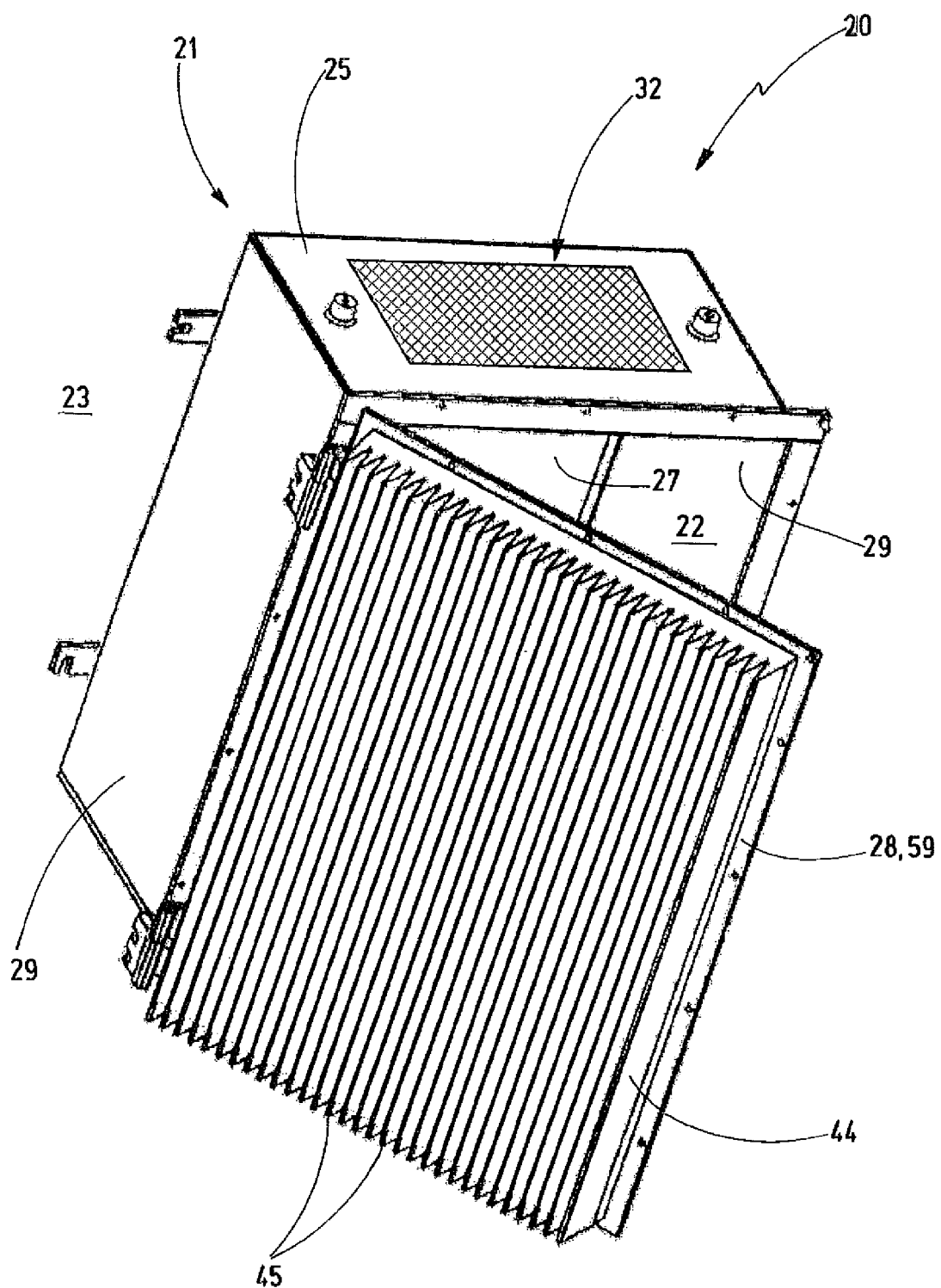
Figure 11:
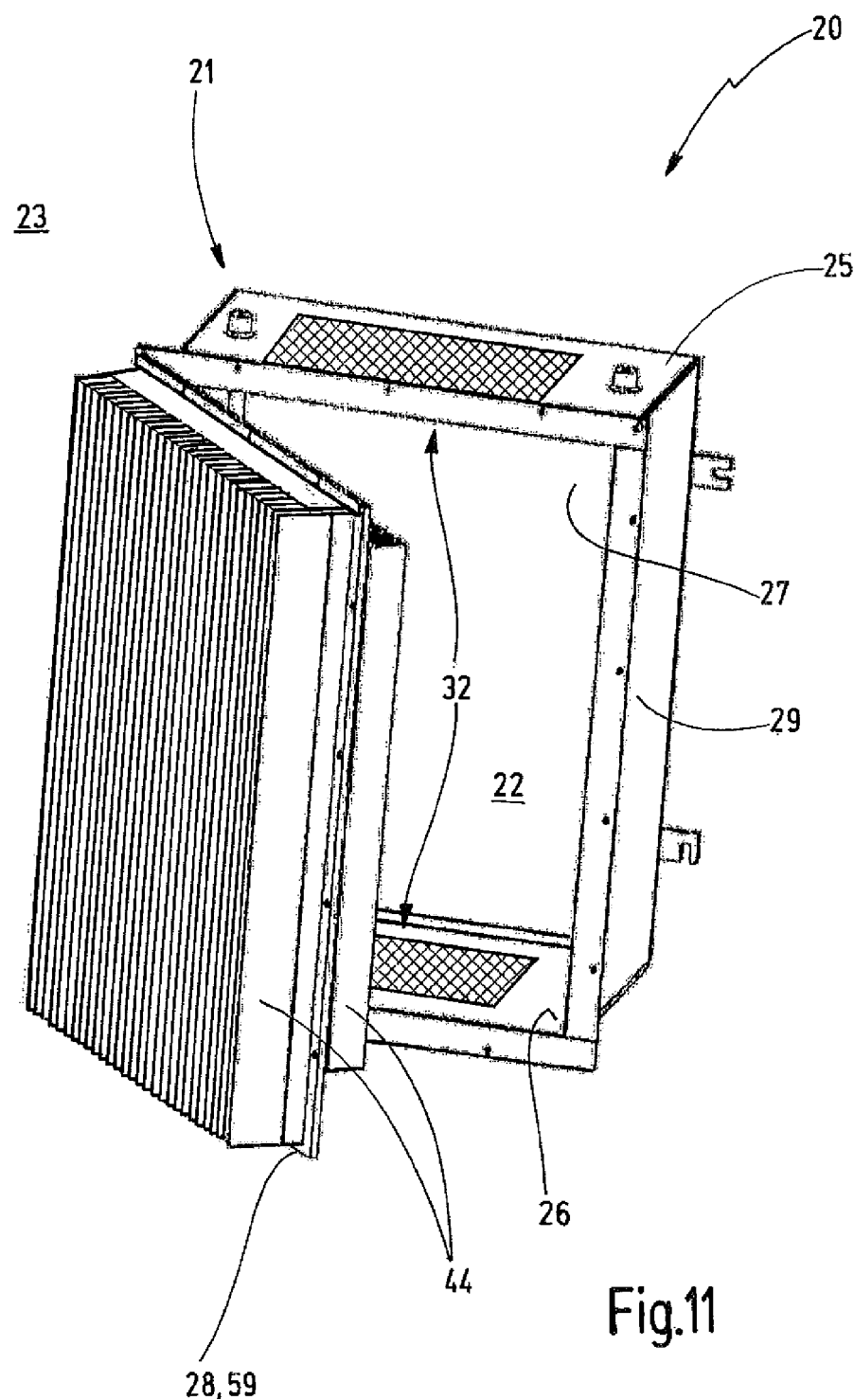
Figure 12:
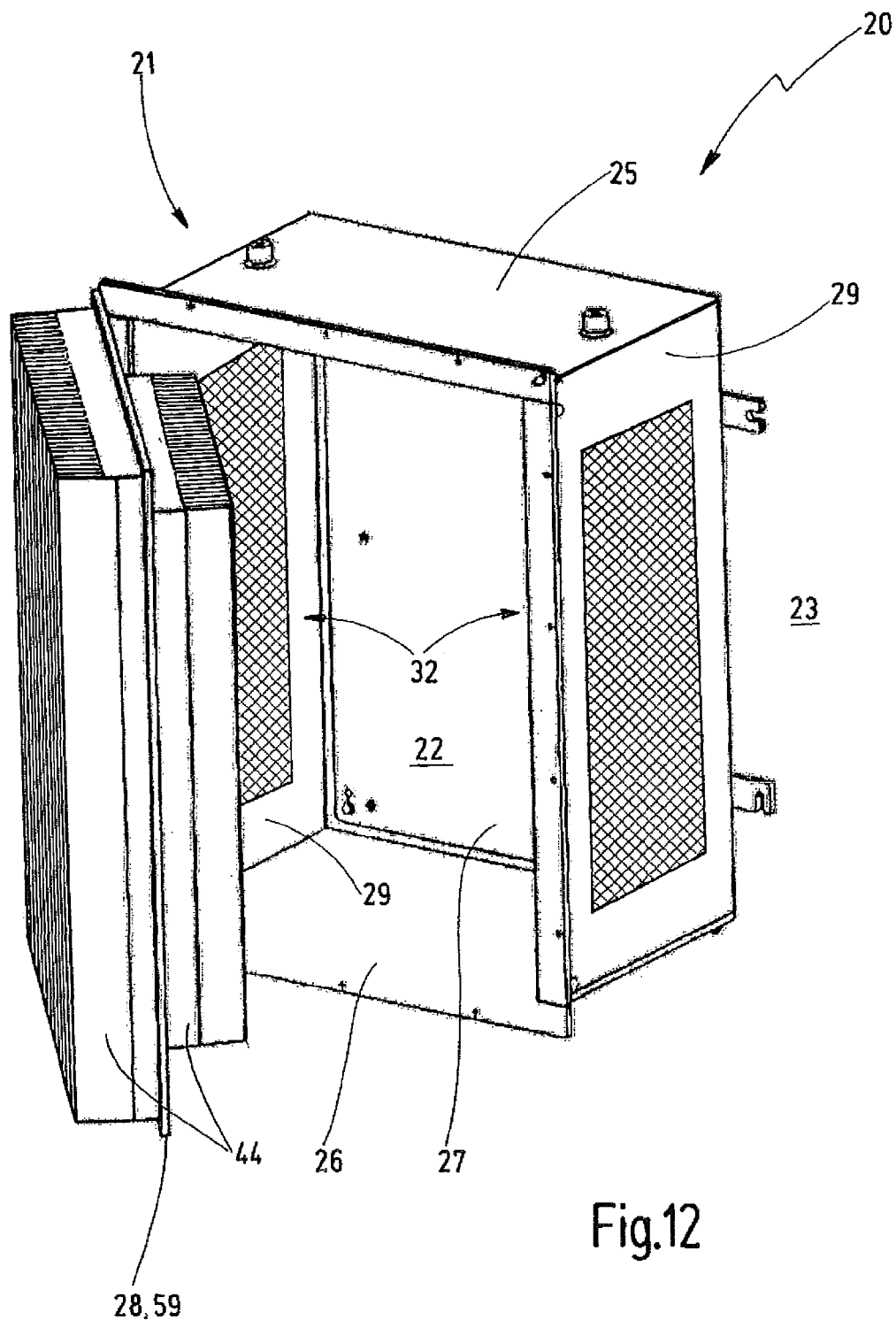

In the embodiment shown in FIG. 9 a heat sink 44 is arranged in the door 59. It is also possible to form the whole door 59 by a heat sink 44. Cooling ribs 45 are provided at the side facing the enclosure interior. As illustrated in FIGS. 10 and 11, in addition or as an alternative cooling ribs 45 can also be present adjoining the environment 23.

This arrangement of the at least one heat sink 44 can be realized in the embodiments according to FIGS. 8-12 as explained above with reference to FIGS. 1-4.

In all of the embodiments a flow channel 56 can be configured adjoining the outer wall 25-29 in which or on which the at least one pressure relief body 34 is present. At least one of the provided pressure relief openings 33 having the at least one pressure relief body 34 adjoins each flow channel 56. The respective outer sides 34b of the pressure relief bodies 34 are assigned to the flow channel 56, such that gas or air from the enclosure interior 22 can flow along the gas flow path through the at least one pressure relief body 34 and further along the flow channel 56. The flow channel 56 is limited transverse to its extension direction by a respective guide device 57 and at least partly by the adjacent outer wall 25-29 or the at least one outer side 34b of the at least one pressure relief body 34. The flow channel 56 is open at opposite ends along its extension. The flow channel 56 extends preferably substantially vertically such that warm air or warm gas can flow from the bottom to the top due to the natural convection in the flow channel 56. In case of substantially vertical orientation of the flow channel 56, it can be protected at its top open end by means of a cover 58 against ingress of dust and/or water (FIG. 5).

The invention refers to an explosion-proof device 20 having an explosion-proof enclosure 21 and a cooling device 43. The explosion-proof enclosure 21 has multiple outer walls 25-29 that enclose an enclosure interior 22 relative to an environment 23 in an explosion-proof manner. A pressure relief arrangement 32 comprises at least one pressure relief opening 33 having at least one gas permeable flameproof pressure relief body 34. The at least one pressure relief opening 33 extends through at least one of the outer walls 25-29. Thus, a flameproof gas flow path between the enclosure interior 22 and the environment 23 is formed. The cooling device 43 comprises in addition at least one heat sink 44 that forms at least one heat sink wall part 47 of one of the outer walls 25, 26, 27, 28, 29 and that as heat sink wall part 47 of this outer wall 25, 26, 27, 28, 29 directly adjoins the environment 23 at the outside and the enclosure interior 22 at the inside. Due to the explosion pressure limitation by means of the pressure relief arrangement 32, a standard heat sink can be used to form the heat sink wall part 47 that is, for example, formed by an extrusion profile part.

REFERENCE SIGNS 20 explosion-proof device
21 explosion-proof enclosure
22 enclosure interior
23 environment
24 electrical or electronic device
25 top outer wall
26 bottom outer wall
27 rear outer wall
28 front outer wall
29 lateral outer wall
32 pressure relief arrangement
33 pressure relief opening
34 pressure relief body
35 fan
36 porous body
37 grid body
38 grid layer
39 holding element
43 cooling device
44 heat sink
45 cooling rib
46 wall recess
47 heat sink wall part
48 enclosure wall part
51 mounting surface
52 intermediate layer
53 mounting wall
54 additional heat sink
55 fan
56 flow channel
57 guide device
58 cover
59 door

The invention claimed is:
1. An explosion-proof device comprising:
an explosion-proof enclosure that comprises multiple outer walls that enclose an enclosure interior and separate it from an explosive atmosphere in an environment in an explosion-proof manner,
a pressure relief arrangement having at least one gas permeable flameproof pressure relief body that is arranged in or on at least one pressure relief opening of the enclosure to form a flameproof gas flow path between the enclosure interior and the environment, and a cooling device having at least one heat sink that forms at least one heat sink wall comprises at least a part of one of the multiple outer walls and that directly adjoins the environment on an outer side and the enclosure interior on an inner side, and has a thermal conductivity greater than the thermal conductivity of the other of the multiple outer walls.

2. The explosion-proof device according to claim 1, wherein the at least one heat sink is inserted in a respected assigned wall recess of one of the outer walls, wherein the wall recess extends completely through the outer wall.

3. The explosion-proof device according to claim 1, wherein the at least one heat sink is connected with one or more of the outer walls at least also by an adhesive bond.

4. The explosion-proof device according to claim 1, wherein the at least one heat sink comprises cooling ribs arranged in the enclosure interior or cooling ribs arranged in the environment.

5. The explosion-proof device according to claim 1, wherein the at least one heat sink is an extrusion part.

6. The explosion-proof device according to claim 1, wherein the at least one gas permeable flameproof pressure relief body has an inner side facing the enclosure interior and an outer side facing the environment.

7. The explosion-proof device according to claim 1, wherein at least one mounting surface for an electrical and/or electronic device to be cooled is provided in the enclosure interior.

8. The explosion-proof device according to claim 7, wherein the at least one heat sink comprises at least one of the at least one mounting surface.

9. The explosion-proof device according to claim 7, wherein at least one mounting wall is provided that comprises at least one of the at least one mounting surface.

10. The explosion-proof device according to claim 9, wherein the at least one heat sink is connected with the at least one mounting wall in a thermally conductive manner.

11. The explosion-proof device according to claim 1, wherein at least one pressure relief opening with respectively one pressure relief body is provided in each of two opposite outer walls.

12. The explosion-proof device according to claim 1, wherein the outer wall that comprises at least one heat sink is configured without pressure relief opening and pressure relief body.

13. The explosion-proof device according to claim 1, wherein the cooling device comprises at least one fan that is arranged in the enclosure interior.

14. The explosion-proof device according to claim 1, wherein the enclosure is configured in the explosion protection category flameproof enclosure.

* * * * *